United States Patent [19]
Bommer et al.

[11] Patent Number: 5,181,084
[45] Date of Patent: Jan. 19, 1993

[54] INFRARED LIGHT EMITTING DIODE WITH GRADING

[75] Inventors: Ulrich Bommer, Eppingen-Rohrbach; Werner Schairer, Weinsberg, both of Fed. Rep. of Germany

[73] Assignee: Telefunken electronic GmbH, Heilbronn, Fed. Rep. of Germany

[21] Appl. No.: 755,096

[22] Filed: Sep. 5, 1991

[30] Foreign Application Priority Data

Oct. 4, 1990 [DE] Fed. Rep. of Germany ....... 4031290

[51] Int. Cl.$^5$ .............................................. H01L 33/00
[52] U.S. Cl. ........................................ 257/94; 257/96; 257/97; 257/101; 257/102
[58] Field of Search .................. 357/17, 45, 16, 90, 357/56, 55, 63; 372/43, 44

[56] References Cited

U.S. PATENT DOCUMENTS

| 4,438,446 | 3/1984 | Tsang | 357/90 X |
| 4,942,439 | 7/1990 | Schairer | 357/90 X |
| 5,060,028 | 10/1991 | Kuo et al. | 357/90 X |

FOREIGN PATENT DOCUMENTS

| 0350242 | 1/1990 | European Pat. Off. |
| 2847451 | 6/1980 | Fed. Rep. of Germany |
| 3235210 | 4/1983 | Fed. Rep. of Germany |

OTHER PUBLICATIONS

Dawson, "High-Efficiency Graded-Band-Gap $Ga_{1-x}Al_xAs$ Light-Emitting Diodes," *Journal of Applied Physics*, vol. 48, No. 6, Jun. 1977, pp. 2485–2492.

Gillessen et al., *Light Emitting Diodes: An Introduction*, Prentice/Hall International, N.J., USA, 1987, pp. 117–125.

Ettenberg et al., "The Reliability of (AlGa)As CW Laser Diodes," *IEEE Journal of Quantum Electronics*, vol. QE-16, No. 2, Feb. 1980, pp. 186–196.

Leibenzeder et al., "Leistungs-Infrarotdiode aus Gallium-Aluminium-Arsenid," *Siemens Forsch.-u. Entwickl-Ber.*, vol. 9, No. 6, 1980, pp. 339–346.

*Primary Examiner*—William Mintel
*Attorney, Agent, or Firm*—Spencer, Frank & Schneider

[57] ABSTRACT

The invention relates to a semiconductor arrangement used in particular for the manufacture of infrared-emitting diodes. A first Si-doped GaAlAs layer containing an n-conductivity zone and a p-conductivity zone is deposited onto an n-doped GaAs semiconductor substrate. The Al content decreases continuously over the thickness of the layer. A second GaAlAs layer is deposited on the p-conductivity first zone of the first GaAlAs layer. The Al concentration of the second layer at the barrier surface with the first layer is greater than the Al concentration of the first GaAlAs layer at the barrier surface with the substrate and decreases continuously with the thickness of the second layer. The curve of the Al concentrations in the two epitaxial layers permits a light guiding effect so that the emitted radiation can, unlike conventional GaAlAs diodes, be output preferably onto those sides of the semiconductor array oriented vertically or perpendicularly to the substrate. With this measure, the semiconductor substrate does not have to be removed for the manufacture of infrared-emitting diodes.

19 Claims, 3 Drawing Sheets

INFRARED LIGHT EMITTING DIODE WITH GRADING

BACKGROUND OF THE INVENTION

The invention relates to an epitaxial semiconductor layer sequence on a semiconductor substrate for use in the manufacture of infrared-emitting diodes. In particular, the invention relates to an epitaxial semiconductor layer sequence made of GaAlAs mixed crystal.

The manufacture of semiconductor diodes from epitaxial GaAlAs mixed crystals to achieve a higher light yield is known from Gillessen et al, light Emitting Diodes, Prentice/Hall International, (Englewood Cliffs, N.J.) 1987, p. 117 ff. To do so, silicon-doped GaAlAs is grown by the liquid-phase epitaxy method onto an n-doped GaAs semiconductor substrate. The temperature of the liquid is reduced from a high temperature at the start of the epitaxial growth to a lower one. The high temperature has the effect that the silicon initially brings about n-doping of the epitaxial layer. At a critical temperature, the conductivity type of the epitaxial layer changes from n to p. The pn-junction is created. At the same time, the aluminum content in the grown layer is steadily reduced from the substrate to the surface, since the liquid is depleted of aluminum.

The semiconductor substrate is now removed with a stop etchant and the diode provided with contacts, with the surface previously forming the barrier surface to the substrate now being the light-emitting surface. Removal of the substrate is necessary to permit light emission at the exposed GaAlAs surface.

Removal of the substrate is technically very difficult and hence expensive. The thin epitaxy layers left behind are very prone to breaking when being handled for further processing. In addition, the high aluminum content makes it difficult to provide the contacts.

The object underlying the invention is therefore to provide a semiconductor arrangement consisting of GaAlAs on a semiconductor substrate that can be used for the manufacture of infrared-emitting diodes whose substrate layer can be retained during diode manufacture.

SUMMARY OF THE INVENTION

The invention concerns a semiconductor arrangement with epitaxial GaAlAs layers on a GaAs substrate. A first Si-doped GaAlAs layer containing an n-conductivity zone and a p-conductivity zone is grown onto an n-doped GaAs semiconductor substrate. The Al or concentration decreases continuously over the thickness of the layer. A second GaAlAs layer is grown onto the p-conductivity zone of the first GaAlAs layer. The Al concentration of the second GaAlAs the barrier surface with the final layer underneath is greater than the Al concentration of the first GaAlAs layer at the barrier surface with the substrate, and decreases continuously with the thickness of the second layer. The curve of the Al concentrations in the two epitaxial layers permits a light guiding effect so that the emitted radiation can—unlike with conventional GaAlAs diodes—be output preferably on those sides of the semiconductor arrangement oriented vertically (perpendicular) to the substrate. With this measure, the semiconductor substrate does not have to be removed for the manufacture of infrared-emitting diodes.

BRIEF DESCRIPTION OF THE DRAWINGS

The invention is explained in the following with the aid of the figures, in which.

DETAILED DESCRIPTION OF PREFERRED EMBODIMENTS

Figure 1:
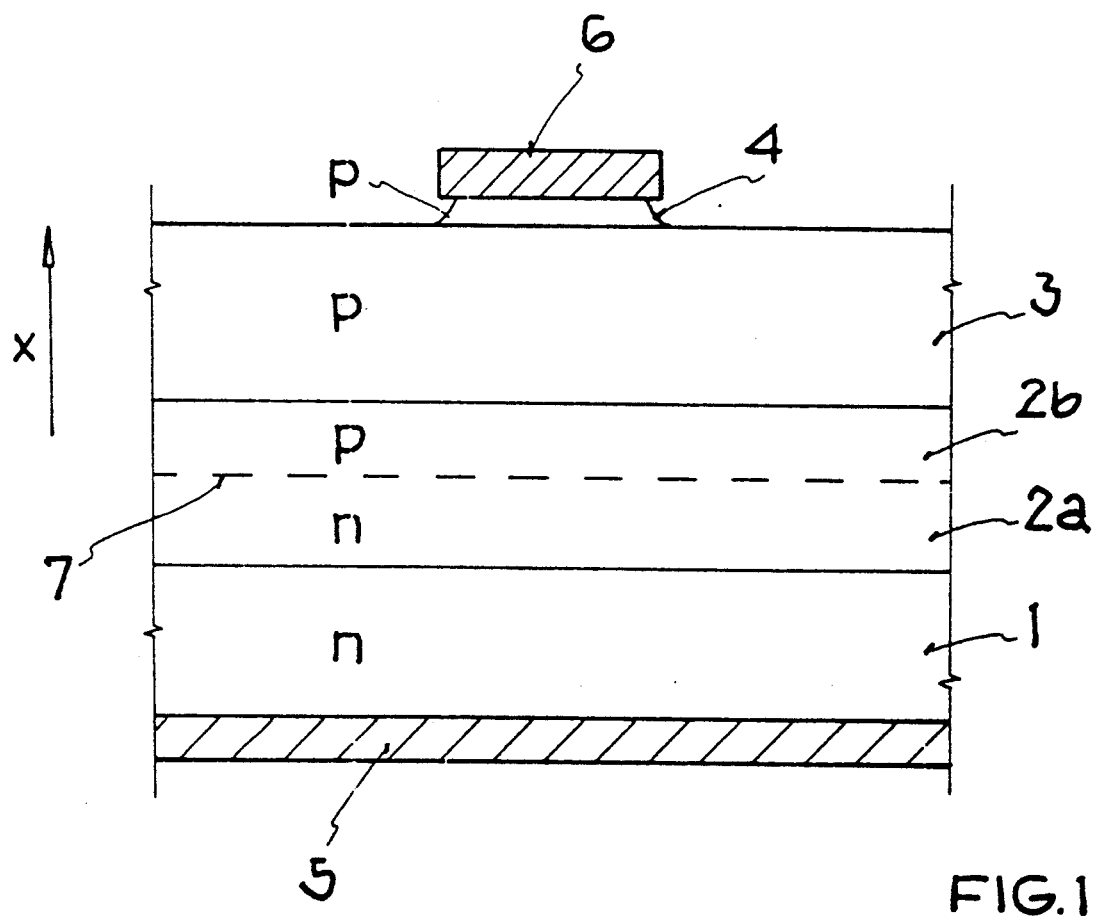
FIG. 1 shows a semiconductor element in accordance with the invention.
Figure 2:
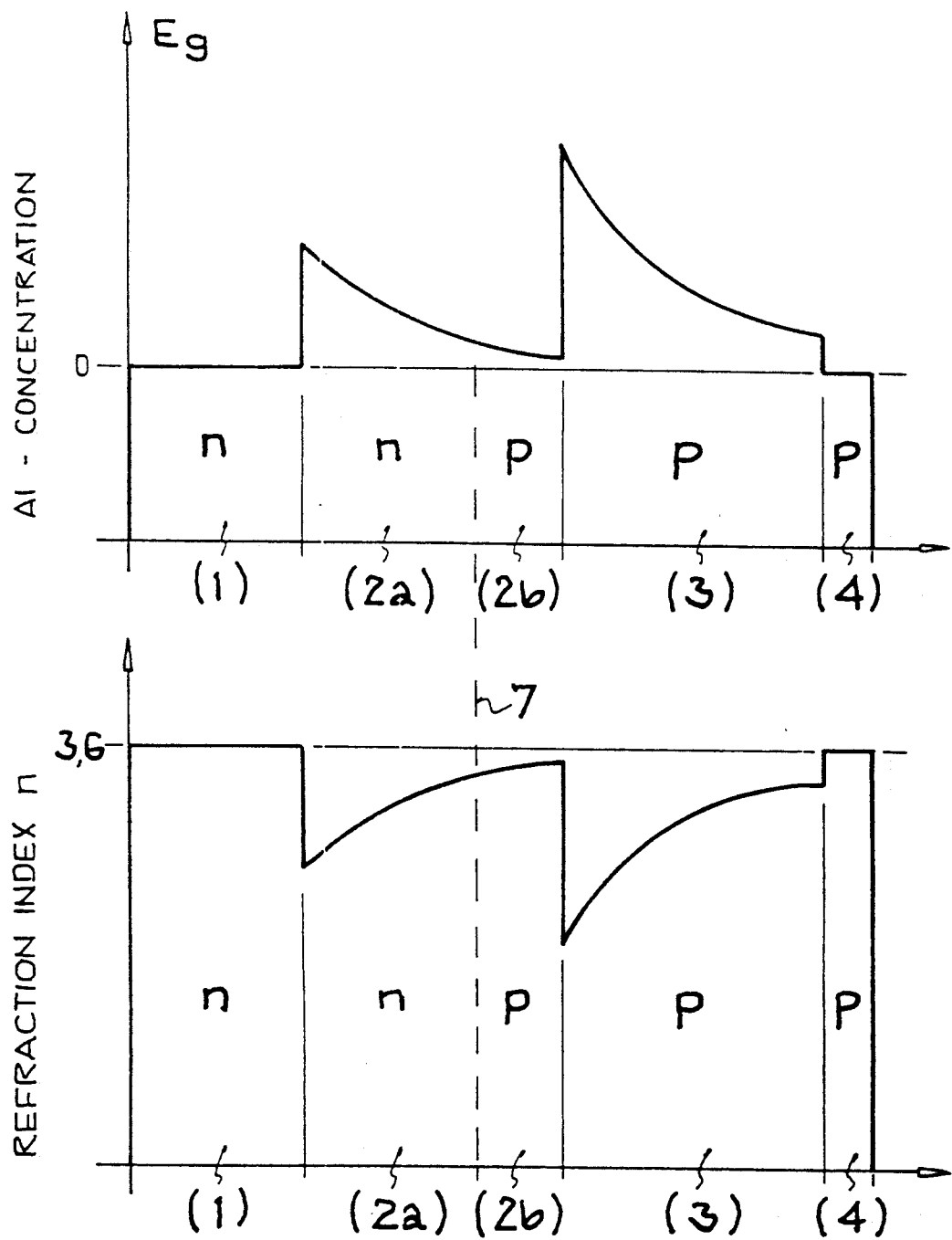
FIG. 2 shows the development of the aluminum concentration and of the refractive index in a semiconductor element in accordance with the invention.

FIG. 1 shows a semiconductor component in accordance with the invention. The semiconductor component comprises a rear contact 5, preferably of Au:Ge, the n-doped GaAs semiconductor substrate 1, the epitaxy layer sequence 2a, 2b, 3, 4 yet to be described, and the bar-like surface contact 6, preferably consisting of Al. The layer sequence contains a first epitaxial layer 2a, 2b with an n-conductivity zone 2a and a p-conductivity zone 2b. The n-conducting zone 2a is 20 to 100 μm thick, and has an aluminum content from 1.5 to 80% at the barrier surface or interface with the substrate and a further curve over the thickness of the layer 2a, 2b as shown in FIG. 2. The p-conductivity zone 2b is approx. 5 to 50 μm thick and is distinguished by the fact that in it the curve of the aluminum concentration steadily continues from the n-conductivity zone 2a. The second layer 3 is p-conductivity is approx. 10 to 80 μm thick, and has an Al content at the barrier surface B with the layer 2b underneath of 10 to 80%. The Al content must be selected such that it is greater than the Al content of the first layer 2a at the barrier surface with the substrate 1. In addition, the Al content at the pn-junction 7 should not be greater than that at the surface of the second layer 3 facing away from the pn-junction. Since the contact resistance of metallic contacts on GaAlAs mixed crystals depends very much on the aluminum concentration and is higher in proportion to how high the Al content is in the GaAlAs, a highly doped p-conductivity GaAs layer 4 is grown onto this second layer 3 to improve the contact characteristics, with the thickness of this layer 4 being selected such that low-ohm contact can be achieved. A typical thickness of 0.1 to 5 μm is sufficient. The contact 6 thus manufactured is distinguished by its low resistance value and excellent reproducibility for manufacture.

FIG. 2 (top) shows the curve of the aluminum concentration over the cross-section in a semiconductor component in accordance with the invention. The band gap $E_g$ is directly proportional to the aluminum concentration and is therefore also plotted in FIG. 2. The aluminum concentration, and hence the band gap also, rises steeply at the transition from the Al-free substrate 1 to the first epitaxial layer 2a and then drops approximately exponentially inside the first epitaxial layer 2a, 2b. At the transition to the second epitaxial layer 3, the aluminum concentration again rises steeply before again falling approximately exponentially inside layer 3. The third epitaxial layer 4 is free of aluminum, so that the aluminum concentration drops steeply at the transition from the second epitaxial layer 3 to the third epitaxial layer 4. The aluminum concentration profile inside the first epitaxial layer 2a, 2b and the second epitaxial layer 3 is achieved when these layers are manufactured using liquid-phase epitaxy. At the start of growth, the liquid is rich in aluminum and, as a result of the high distribution coefficient, a large amount of Al is initially incorporated in the mixed crystal. As a result, the liquid is rapidly depleted of aluminum so that the aluminum concentration in the crystal also falls rapidly.

Since the pn-junction 7 is achieved by amphoteric Si doping, it is inside the first epitaxial layer 2a, 2b. The curve of the aluminum concentration is continued steadily on both sides of the pn-junction 7. By embedding the pn-junction in two zones 2a, 2b containing aluminum, the absorption of the emitted radiation is greatly reduced.

FIG. 2 (bottom) shows the curve of the refractive index n in a semiconductor component in accordance with the invention. The refractive index n depends on the aluminum concentration in the crystal and is smaller in proportion to how great the aluminum concentration is. The curve of the refractive index in the region of the pn-junction 7 results in a light guiding effect, with the n-doped zone 2a of the first epitaxial layer deflecting the electromagnetic radiation in the direction of the pn-junction plane 7 as a result of the gradient of the refractive index. This represents a major contribution to improvement of the light output parallel to the pn-junction 7.

The epitaxial layers are manufactured using the known liquid-phase epitaxy method. The semiconductor substrate wafers are initially cleaned in a mixture of $H_2SO_4$, $H_2O_2$ and $H_2O$ in a ratio of 8:1:1. The etching time is approx. 2 mins. at a typical temperature of 60° C. The crystal orientation of the substrates is advantageously <100> or <111>, the present example assuming the orientation 100. The composition of the individual epitaxy liquids depends, in detail, on the required doping, the planned layer thickness, the required aluminum profile and the epitaxy temperature. These parameters must be optimized to a high output of the semiconductor component to be manufactured. The initial weights of the following constituents of the respective epitaxy liquid relate in each case to the basic element of gallium. The first liquid for the first epitaxy layer 2a, 2b contains 5.5 to 6.5% GaAs, 0.03 to 0.2% aluminum, 0.7 to 0.8% silicon. The second liquid for the second epitaxy layer 3 contains 2.5 to 3.5% GaAs, 0.1 to 0.3% aluminum and 0.6 to 0.7% germanium or another p-doping material such as zinc, magnesium or silicon. The third liquid for growing the GaAs layer 4 for improving the contact characteristics contains 0.9% GaAs and 0.8% germanium or the dopant of the second liquid.

The precise compositions of the epitaxy liquids for two explicit examples a and b are given in Table 1.

TABLE 1

| Example | Melt No. | GaAs % | Al % | Si % | Ge % |
|---------|----------|--------|------|------|------|
| a       | 1        | 6.2    | 0.05 | 0.75 |      |
|         | 2        | 3.3    | 0.2  | —    | 0.65 |
|         | 3        | 1.6    | —    | —    | 0.8  |
| b       | 1        | 5.7    | 0.14 | 0.75 |      |
|         | 2        | 2.8    | 0.2  | —    | 0.62 |
|         | 3        | 0.9    | —    | —    | 0.8  |

The liquids are poured into the containers provided in the epitaxy boat, and the boat is placed inside the epitaxy reactor. The temperature in the reactor is increased to the first holding temperature T1 (approx. 400° C.) and maintained for about 30 mins. At this temperature any gallium oxide left on the substrate wafers and in the epitaxy boat disintegrates.

At the second holding temperature T2 (approx. 1000° C.), all initial weights in the liquids dissolve and the liquids become homogeneous at the same time.

From now on, the temperature in the epitaxy reactor is continuously lowered with a cooling rate of 0.8 to 1° C. per minute.

When the temperature T3 (approx. 900°–920° C.) is reached, the substrate wafers are immersed in the first liquid. An n-conductivity GaAlAs layer 2a is first grown, of which the aluminum content steadily decreases (FIG. 2). At approx. 878° C., the changeover from n to p-conductivity takes place. The pn-junction 7 is therefore achieved in one liquid and in one process step. The n-conducting zone 2b of the first epitaxial layer now grows. The aluminum content in the crystal continues to fall.

At the temperature T4 (approx. 840° to 870° C.), the wafers are removed from the first liquid and immersed in the second. A p-conductivity GaAlAs layer 3 now grows whose Al content at the barrier surface with the previously grown layer 2a-2b is higher than the Al content of the previously grown layer 2a-2b at the barrier surface with the substrate 1.

Once the required layer thickness has grown, the wafers are removed from the second liquid at a temperature T5 (approx. 720° to 790° C.). If no further epitaxy layer is to be grown, the epitaxy reactor is cooled down to the ambient temperature. In addition a p-conductivity GaAs epitaxy layer 4 is grown to improve the contact properties. To do so, the substrate wafers are immersed in the third liquid, which is approximately saturated with As at the temperature T5. After growing on a layer with a typical thickness in the range from 0.4 to 4 μm, the wafers are removed from the liquid. The epitaxy reactor is cooled down to the ambient temperature.

Figure 3:
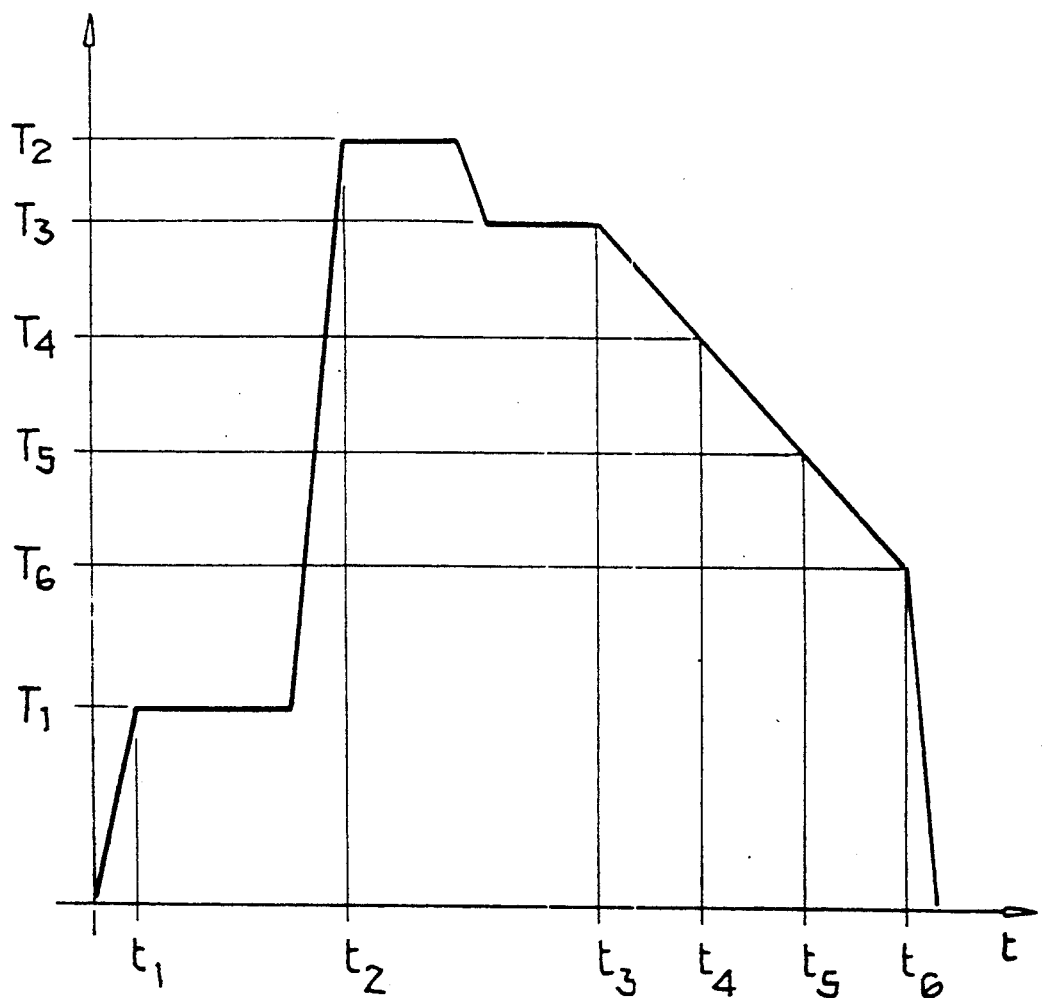
FIG. 3 shows the temperature curve in an epitaxy reactor during the manufacture of epitaxy layers.

The temperature curve of the epitaxy process is shown in FIG. 3. The precise temperatures T1 to T6 for the two explicit examples a and b are given in the Table 2.

TABLE 2

| Example | T1   | T2    | T3   | T4   | T5   | T6   |
|---------|------|-------|------|------|------|------|
| a       | 400° | 1000° | 915° | 865° | 776° | 764° |
| b       | 400° | 1000° | 915° | 850° | 730° | 715° |

Table 3 states the layer thicknesses and the aluminum concentrations for the two embodiments a and b. Al1 is the aluminum concentration on the side facing the substrate, Al2 that on the side of the respective layer facing away from the substrate.

TABLE 3

| Example | Epitaxy layer | Al1 in % | Al2 in % | Thickness in μm |
|---------|---------------|----------|----------|-----------------|
| a       | 2a            | 5        | 1.8      | 30              |
|         | 2b            | 1.8      | 1.2      | 15              |
|         | 3             | 20       | 4        | 50              |
|         | 4             | 0        | 0        | 3               |
| b       | 2a            | 14       | 5.2      | 30              |
|         | 2b            | 5.2      | 3.6      | 15              |
|         | 3             | 20       | 4        | 50              |
|         | 4             | 0        | 0        | 3               |

The semiconductor elements are provided with contacts in a subsequent process step. The rear is coated with Au:Ge over the full surface or in a structured manner. On the upper side of the semiconductor arrangement, a bar-like structured aluminum layer is deposited. If the contact-promoting GaAs layer is present on the upper side, the GaAs is etched off again outside the contact area using a stop etchant, for example a mixture of H₂O₂, NH₄OH and H₂O, after the contacts have been structured.

After dividing the semiconductor wafers and installing the chips in a 5 mm housing typical for infrared diodes, the following emission outputs are obtained:

TABLE 4

| Example | $\phi_e$/mW $I_F = 100$ mA | $U_F$/V $I_F = 1.5 A$ | $p$/nm |
|---|---|---|---|
| a | 26.5 | 2.2 | 930 |
| b | 22.0 | 2.4 | 900 |

The output, particularly of example a, corresponds to that of the diode described at the outset (prior art) with greatly improved producibility.

Known GaAs diodes without Al emit typical outputs of $\phi_e$ (100 mA) = 15 mW.

What is claimed is:

1. A semiconductor arrangement for a light emitting diode comprising: an epitaxial semiconductor layer sequence on a semiconductor substrate made of monocrystalline GaAs of n-conductivity type, and wherein said sequence includes a first silicon-doped epitaxial GaAlAs layer provided on said semiconductor substrate and having an aluminum concentration of 1.5 to 80% at its barrier surface with said semiconductor substrate and decreasing over its layer thickness, said first layer having a first zone of n-conductivity type at said barrier surface with said substrate and a second zone of p-conductivity type forming a pn-junction with said first zone, and a second epitaxial GaAlAs layer of p-conductivity type provided on said first epitaxial GaAlAs layer, and having an aluminum concentration at its barrier surface with said first epitaxial GaAlAs layer of 10–80% and which decreases over the thickness of said second layer.

2. A semiconductor arrangement according to claim 1, wherein said second epitaxial GaAlAs layer is doped with Ge to achieve said p-conductivity type.

3. A semiconductor arrangement according to claim 2, wherein the aluminum concentration of said second epitaxial GaAlAs layer at the barrier surface with said first epitaxial GaAlAs layer is 25–50%.

4. A semiconductor arrangement according to claim 3, wherein the aluminum concentration at the pn-junction is 0.2–30%.

5. A semiconductor arrangement according to claim 4, wherein the aluminum concentration at a surface of said second epitaxial layer facing away from said pn-junction is 2–30%.

6. A semiconductor arrangement according to claim 5, wherein the aluminum concentration at said surface of said second epitaxial layer facing away from said pn-junction is greater than the aluminum concentration at said pn-junction.

7. A semiconductor arrangement according to claim 1, wherein the thickness of said first epitaxial GaAlAs layer is 20–150 μm, with said first zone being approximately 40 μm and said second zone being approximately 20 μm thick.

8. A semiconductor arrangement according to claim 6, wherein first and second contacts are provided respectively on a rear surface of said substrate, and as a bar on a top surface of said epitaxial layer sequence, whereby the semiconductor array is an infrared diode.

9. A semiconductor arrangement according to claim 8, wherein said layer sequence includes a further epitaxial layer of GaAs of p-conductivity type provided between said second epitaxial GaAlAs layer and said second contact, with said further layer being doped with at least one of germanium, silicon, magnesium and zinc, having a thickness from 0.1 to 5μ, and being etched away outside its contact area with said second contact.

10. A semiconductor arrangement according to claim 6, wherein the thickness of said first epitaxial GaAlAs layer is 20–150 μm, with said first zone being approximately 40 μm and said second zone being approximately 20 μm thick.

11. A semiconductor arrangement according to claim 8, wherein said first contact is provided on the entire said rear surface of said substrate.

12. A semiconductor arrangement according to claim 8, wherein said first contact is provided on said rear surface of said substrate in a patterned manner.

13. An arrangement according to claim 1, wherein: the aluminum concentration at a surface of said second epitaxial layer facing away from said pn-junction is greater than the aluminum concentration at said pn-junction; and wherein the aluminum concentration in each of said first and second epitaxial layers continuously decreases.

14. An arrangement according to claim 13, wherein: the aluminum concentration of said second epitaxial layer at its barrier surface with said first epitaxial layer is greater than the aluminum concentration of said first epitaxial layer at its barrier surface with said substrate.

15. An arrangement according to claim 1, wherein: the aluminum concentration of said second epitaxial layer at its barrier surface with said first epitaxial layer is greater than the aluminum concentration of said first epitaxial layer at its barrier surface with said substrate.

16. An infrared emitting diode comprising:
   an n-doped GaAs semiconductor substrate;
   a first GaAlAs epitaxial layer on a surface of said substrate and doped with Si to produce an n-conductivity type first zone at said surface of said substrate followed by a p-conductivity type second zone, said first layer having an aluminum concentration which continuously decreases from a maximum value at said surface of said substrate;
   a p-doped second GaAlAs epitaxial layer disposed on a surface of said p-type conductivity second zone of said first GaAlAs epitaxial layer; said second layer having an aluminum concentration which continuously decreases from a maximum value at its barrier surface with said second zone to an outer surface of said second epitaxial layer, which is greater at said barrier surface with said second zone than the aluminum concentration of said first layer at its barrier surface with said substrate, and which is greater at its said outer surface than the aluminum concentration of said first layer at said pn-junction;
   a first electrical contact for said outer surface of said second layer; and
   a second electrical contact on a rear outer surface of said substrate.

17. An infrared diode according to claim 16 wherein said first electrical contact layer has a bar shape and further comprising a p-conductivity type GaAs epitaxial layer formed on said outer surface of said second layer only beneath said bar shaped first electrical contact layer.

18. An infrared diode according to claim 17, wherein said second electrical contact covers said rear surface of said substrate.

19. An infrared diode according to claim 16 wherein: said maximum aluminum concentration of said first epitaxial GaAlAs layer is from approximately 1.5 to 80%; said maximum aluminum concentration of said second epitaxial GaAlAs layer is from approximately 10–80%; said aluminum concentration of said first epitaxial GaAlAs layer at said pn-junction is from approximately 0.2–30%; and said aluminum concentration at said outer surface of said second epitaxial GaAlAs layer is from approximately 2–30%.

* * * * *